(12) United States Patent
Shen et al.

(10) Patent No.: US 12,027,374 B2
(45) Date of Patent: Jul. 2, 2024

(54) PROCESSES TO DEPOSIT AMORPHOUS-SILICON ETCH PROTECTION LINER

(71) Applicant: Applied Materials, Inc., Santa Clara, CA (US)

(72) Inventors: Zeqing Shen, Santa Clara, CA (US); Bo Qi, San Jose, CA (US); Abhijit B. Mallick, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 228 days.

(21) Appl. No.: 17/246,209

(22) Filed: Apr. 30, 2021

(65) Prior Publication Data
US 2022/0351982 A1 Nov. 3, 2022

(51) Int. Cl.
*H01L 21/311* (2006.01)
*H01L 21/02* (2006.01)

(52) U.S. Cl.
CPC .. *H01L 21/31144* (2013.01); *H01L 21/02211* (2013.01); *H01L 21/02271* (2013.01); *H01L 21/31111* (2013.01)

(58) Field of Classification Search
CPC ......... H01L 21/31144; H01L 21/02211; H01L 21/02271; H01L 21/31111
See application file for complete search history.

(56) References Cited

U.S. PATENT DOCUMENTS

| | | | |
|---|---|---|---|
| 7,589,024 B2 | 9/2009 | Ueda | |
| 7,838,373 B2 | 11/2010 | Giles et al. | |
| 8,389,416 B2 | 3/2013 | Luong | |
| 8,637,384 B2 | 1/2014 | Ando et al. | |
| 8,765,574 B2 | 7/2014 | Zhang et al. | |
| 8,980,763 B2 | 3/2015 | Wang et al. | |
| 8,994,081 B2 | 3/2015 | Leobandung | |
| 9,064,816 B2 | 6/2015 | Kim et al. | |
| 9,190,486 B2 | 11/2015 | Xie et al. | |

(Continued)

FOREIGN PATENT DOCUMENTS

| | | |
|---|---|---|
| WO | 2016064513 A1 | 4/2016 |
| WO | 2020190878 A1 | 9/2020 |

OTHER PUBLICATIONS

International Search Report and Written Opinion dated Aug. 2, 2022 for Application No. PCT/US2022/022988.

*Primary Examiner* — Michael Carter
*Assistant Examiner* — Andre C Stevenson
(74) *Attorney, Agent, or Firm* — Patterson + Sheridan, LLP (57) ABSTRACT

Embodiments of the present disclosure generally relate to fabricating electronic devices, such as memory devices. In one or more embodiments, a method for forming a device includes forming a film stack on a substrate, where the film stack contains a plurality of alternating layers of oxide layers and nitride layers and has a stack thickness, and etching the film stack to a first depth to form a plurality of openings between a plurality of structures. The method includes depositing an etch protection liner containing amorphous-silicon on the sidewalls and the bottoms of the structures, removing the etch protection liner from at least the bottoms of the openings, forming a plurality of holes by etching the film stack in the openings to further extend each bottom of the openings to a second depth of the hole, and removing the etch protection liner from the sidewalls.

20 Claims, 5 Drawing Sheets

(56) References Cited

U.S. PATENT DOCUMENTS

| | | |
|---|---|---|
| 9,276,064 B1 | 3/2016 | Zang et al. |
| 9,305,937 B1 | 4/2016 | Tsutsumi et al. |
| 9,412,608 B2 | 8/2016 | Wang et al. |
| 9,419,107 B2 | 8/2016 | Zhang et al. |
| 9,484,447 B2 | 11/2016 | Kim et al. |
| 9,490,340 B2 | 11/2016 | Koh et al. |
| 10,396,152 B2 | 8/2019 | Cheng et al. |
| 10,777,650 B2 | 9/2020 | Sun et al. |
| 10,886,140 B2 | 1/2021 | Jiang et al. |
| 2006/0043521 A1* | 3/2006 | Trivedi ............ H01L 21/76224 |
| | | 257/E21.546 |
| 2007/0111373 A1 | 5/2007 | Ueda |
| 2014/0134842 A1 | 5/2014 | Zhang et al. |
| 2014/0154889 A1 | 6/2014 | Wang et al. |
| 2014/0199850 A1 | 7/2014 | Kim et al. |
| 2015/0179464 A1 | 6/2015 | Wang et al. |
| 2015/0311089 A1 | 10/2015 | Kim et al. |
| 2016/0111439 A1 | 4/2016 | Tsutsumi et al. |
| 2017/0194430 A1 | 7/2017 | Wood et al. |
| 2020/0035505 A1 | 1/2020 | Jiang et al. |
| 2020/0035694 A1* | 1/2020 | Kaminaga ............... H10B 43/20 |
| 2020/0411656 A1 | 12/2020 | Sun et al. |
| 2021/0020431 A1* | 1/2021 | Blanquart ........... H01L 21/0234 |
| 2021/0118691 A1 | 4/2021 | Jiang et al. |
| 2022/0051938 A1* | 2/2022 | Wu .................. H01L 21/02263 |
| 2022/0199417 A1 | 6/2022 | Henri et al. |

\* cited by examiner

PROCESSES TO DEPOSIT AMORPHOUS-SILICON ETCH PROTECTION LINER

BACKGROUND

Field

Embodiments of the present disclosure generally relate to methods for fabricating electronic devices, and more specifically to methods of using etch protection layers during the fabrication of electronic devices.

Description of the Related Art

Microelectronic technology has advanced at a rapid pace and device dimensions have shrunk with advancing technology to provide faster processing and storage per unit space. As microelectronic technology advances, the market demands increasing smaller chips with increasingly more structures per unit area. One class of devices which has seen many advances in miniaturization are memory devices.

Two of the mainstays of the memory segment are NOT-AND (NAND) flash and dynamic random-access memory (DRAM). DRAM is dynamic, volatile and very fast, making it well suited for short term system memory. Conversely, NAND flash is non-volatile, which means it has good retention and can function well for long term storage. Higher speed, higher density and lower bit cost have been the main goals for both of these memory types as demand continues to increase. DRAM has continued the path of scaling to smaller cell designs. This dimension shrink has driven the introduction of multiple patterning technology. Planar NAND was also facing scaling restrictions, and ultimately changed course to move in the vertical direction. This vertical integration has relaxed the lithography requirements for 3D NAND devices, and has instead migrated the most complex process challenges to deposition and etch. As the demand for higher density increases, the typical approach in NAND devices has been to stack more layers. Yet additional layers result in thicker stacks which are increasingly difficult to etch due to increasing aspect ratios.

The primary structure is fabricated by alternating film depositions, then completing a high aspect ratio etch through the entire stack. Each new node in 3D NAND takes the process to an even higher vertical stack. High aspect ratio structures have unique process control requirements since the channels are on the order of microns deep with angstrom-level requirements for precision. Vertical NAND (V-NAND) and 3D-NAND are various structural devices used in flash memory applications. V-NAND devices are vertically stacked NAND structures with a large number of cells arranged in blocks. Prior to word line formation, the substrate is a layered oxide stack. A memory string is formed in a gap or slit that passes vertically through the layered oxide and nitride (ON) stack. As the number of ON pairs and tiers increases to achieve high capacity, the aspect ratio of a feature, such as memory holes, or slits, increases greatly (>20). As a result, etching of these high aspect ratio structures is becoming increasingly challenging. Often bow critical dimension (CD) and delta CD is out of design specification. Advancement of etch tool's hardware and process may not be fast enough to address these issues.

Therefore, there is a need for methods of etching that protect the sidewall of a microelectronic device, such as a memory device, so that the bow CD is greatly reduced relative to traditional devices.

SUMMARY

Embodiments of the present disclosure generally relate to fabricating electronic devices, such as memory devices. More specifically, embodiments relate to methods which utilize etch protection liners during the fabrication of electronic devices.

In one or more embodiments, a method for forming a device includes forming a film stack on a substrate, where the film stack contains a plurality of alternating layers of oxide layers and nitride layers and has a stack thickness, and etching the film stack to a first depth to form a plurality of openings between a plurality of structures. Each structure has a sidewall and each opening has a bottom, the first depth is less than the stack thickness, and each opening has an aspect ratio of greater than 50 relative to the first depth. The method also includes depositing an etch protection liner containing amorphous-silicon on the sidewalls and the bottoms, removing the etch protection liner from at least the bottoms of the openings, forming a plurality of holes by etching the film stack in the openings to further extend each bottom of the openings to a second depth of the hole, and removing the etch protection liner from the sidewalls.

In other embodiments, a method for forming a device includes forming a film stack on a substrate, where the film stack contains a plurality of alternating layers of oxide layers and nitride layers and has a stack thickness, forming a patterned hard mask on the film stack, and etching the film stack to a first depth to form a plurality of openings between a plurality of structures. Each structure has a sidewall and each opening has a bottom, the first depth is less than the stack thickness, and each opening has an aspect ratio of greater than 100 relative to the first depth. The method also includes depositing an etch protection liner containing amorphous-silicon on the sidewalls and the bottoms by a thermal chemical vapor deposition (CVD) process, where the etch protection liner has a thickness of about 1 nm to about 50 nm. The method further includes removing the etch protection liner from at least the bottoms of the openings, forming a plurality of holes by etching the film stack in the openings to further extend each bottom of the openings to a second depth of the hole, and removing the etch protection liner from the sidewalls.

In some embodiments, a microelectronic device is provided and includes a film stack disposed on a substrate, wherein the film stack contains a plurality of alternating layers of oxide layers and nitride layers and has a stack thickness, a patterned hard mask disposed on an upper surface of the film stack, and a plurality of openings having a first depth disposed between a plurality of structures. Each structure has a sidewall and each opening has a bottom, where the first depth is less than the stack thickness, and each opening has an aspect ratio of greater than 100 relative to the first depth. The microelectronic device also includes an etch protection liner containing amorphous-silicon disposed on the patterned hard mask, the sidewalls, and the bottoms, where the etch protection liner has a thickness of about 1 nm to about 50 nm.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to fabricating electronic devices, such as memory devices. More specifically, embodiments relate to methods which utilize etch protection liners during the fabrication of electronic devices. The etch protection liners contain amorphous-silicon deposited on the sidewalls and the bottoms of very high aspect ratio structures and feature. The etch protection liners containing amorphous-silicon provide great control when etching in order to significantly reduce or eliminate bow critical dimension (CD).

Figure 1:
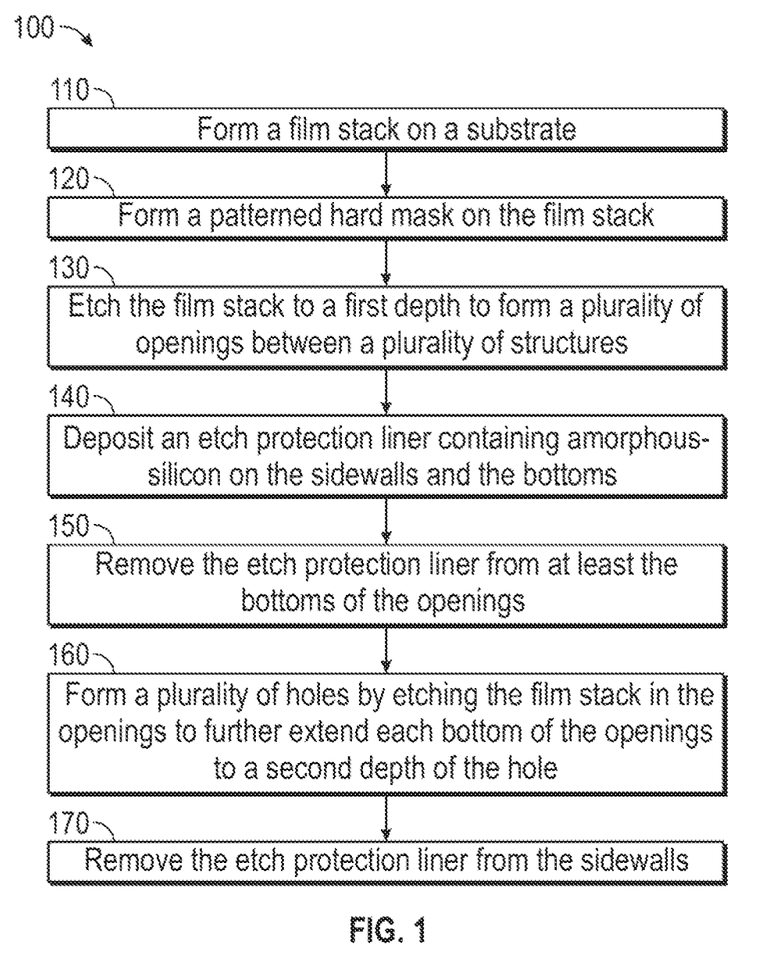
FIG. 1 is a flow chart of a method of forming an electronic device, according to one or more embodiments described and discussed herein.

FIG. 1 is a flow chart of a method 100 of forming a microelectronic device, such as a memory device, according to one or more embodiments described and discussed herein. The method 100 includes, but is not limited to, multiple operations and manufacturing processes for fabricating the microelectronic device. FIGS. 2A-2H depict a cross-sectional view of an exemplary microelectronic device 200 being prepared during various manufacturing processes of the method 100, according to one or more embodiments described and discussed herein.

Figure 2A:
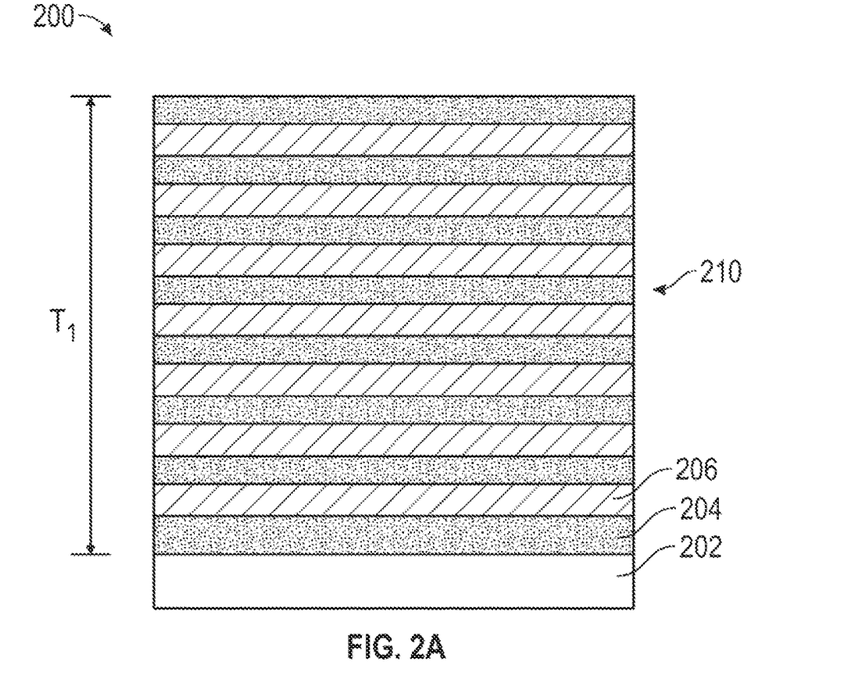
FIGS. 2A-2H depict a cross-sectional view of an exemplary electronic device being prepared during various manufacturing processes, according to one or more embodiments described and discussed herein.

At operation 110 of the method 100, a film stack 210 is deposited, disposed, or otherwise formed on a substrate 202, as depicted in FIG. 2A. The film stack 210 contains a plurality of alternating layers of oxide layers 204 and nitride layers 206. Each of the oxide layers 204 can be or include silicon oxide, silicon dioxide, or dopants thereof and each of the nitride layers 206 can be or include silicon nitride or dopants thereof. In some embodiments, the plurality of alternating layers of oxide layers 204 and nitride layers 206 can include about 20 pairs to about 200 pairs of oxide layers 204 and nitride layers 206. In other configurations, the plurality of alternating layers of oxide layers 204 and nitride layers 206 can include about 30 pairs to about 150 pairs, about 32 pairs to about 120 pairs, or about 48 pairs to about 60 pairs, of oxide layers 204 and nitride layers 206.

The substrate 202 can be or include any suitable substrate material. In one or more embodiments, the substrate 202 contains a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In some embodiments, the substrate 202 contains one or more of silicon (Si), germanium (Ge), gallium (Ga), arsenic (As), indium (In), phosphorus (P), copper (Cu), or selenium (Se). Although a few examples of materials from which the substrate 202 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be fabricated is within the spirit and scope of the present disclosure.

The film stack 210 has a stack thickness (Ti). The stack thickness (Ti) can be about 0.5 μm, about 0.8 μm, about 1 μm, about 1.5 μm, or about 1.8 μm to about 2 μm, about 3 μm, about 4 μm, about 5 μm, about 6 μm, about 7 μm, about 8 μm, about 9 μm, about 10 μm, about 12 μm, about 15 μm, about 20 μm, or greater. For example, the stack thickness (Ti) can be about 0.5 μm to about 20 μm, about 0.5 μm to about 15 μm, about 0.5 μm to about 12 μm, about 0.5 μm to about 10 μm, about 0.5 μm to about 8 μm, about 0.5 μm to about 5 μm, about 0.5 μm to about 3 μm, about 0.5 μm to about 2 μm, about 1 μm to about 20 μm, about 1 μm to about 15 μm, about 1 μm to about 12 μm, about 1 μm to about 10 μm, about 1 μm to about 8 μm, about 1 μm to about 5 μm, about 1 μm to about 3 μm, about 1 μm to about 2 μm, about 2 μm to about 20 μm, about 2 μm to about 15 μm, about 2 μm to about 12 μm, about 2 μm to about 10 μm, about 2 μm to about 8 μm, about 2 μm to about 5 μm, or about 2 μm to about 3 μm.

Figure 2B:
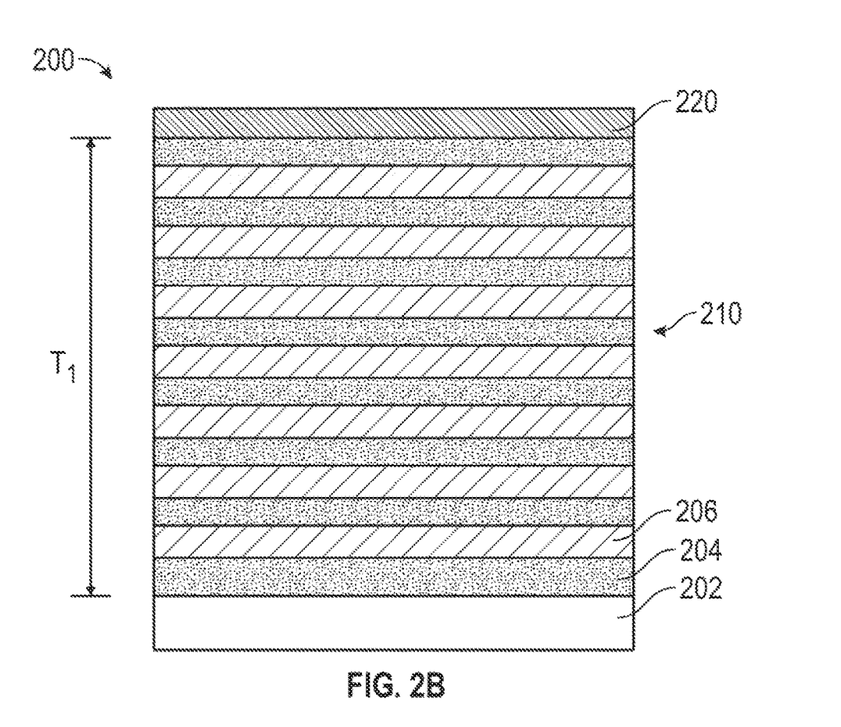
Figure 2C:
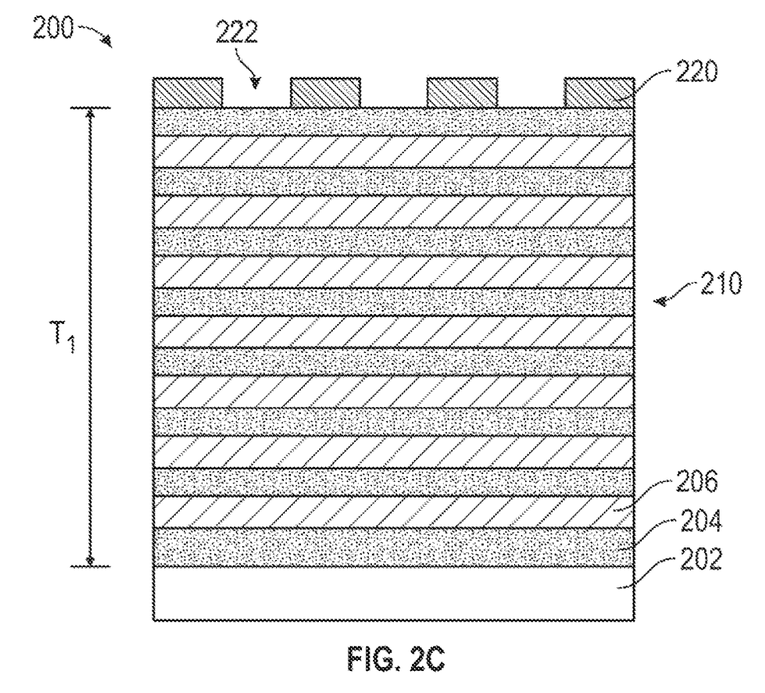

At operation 120 of the method 100, a patterned hard mask 220 is deposited, disposed, or otherwise formed on the film stack 210, as depicted in FIGS. 2B and 2C. In one or more embodiments, the patterned hard mask 220 may be formed by any suitable process. In some embodiments, the patterned hard mask 220 is formed as a blanket hard mask (FIG. 2B) on the film stack 210 and subsequently etched to form a plurality of openings 222 within the patterned hard mask 220 (FIG. 2C). In other embodiments, the patterned hard mask 220 is deposited as a hard mask with a pattern (e.g., patterned printing), as depicted in FIG. 2C.

The patterned hard mask 220 has a plurality of openings 222 which exposes portions of the film stack 210 forming a pattern, as depicted in FIG. 2C. This pattern is the portions of the film stack 210 to be etched in subsequent operations. In one or more embodiments, each of the openings 222 can have a diameter or width of about 1 nm, about 10 nm, about 50 nm, about 100 nm, about 200 nm, about 300 nm, or about 400 nm to about 500 nm, about 750 nm, about 1,000 nm, about 1,500 nm, about 2,000 nm, about 2,500 nm, about 3,000 nm, or greater. For example, each of the openings 222 can have a diameter or width of about 1 nm about 3,000 nm, about 1 nm about 2,000 nm, about 1 nm about 1,000 nm, about 1 nm about 800 nm, about 1 nm about 500 nm, about 1 nm about 300 nm, about 1 nm about 100 nm, about 100 nm about 3,000 nm, about 100 nm about 2,000 nm, about 100 nm about 1,000 nm, about 100 nm about 800 nm, about 100 nm about 500 nm, about 100 nm about 300 nm, about 100 nm about 200 nm, about 500 nm about 3,000 nm, about 500 nm about 2,000 nm, about 500 nm about 1,000 nm, about 500 nm about 800 nm, or about 500 nm about 600 nm.

In other embodiments, each of the openings 222 can have a diameter or width of about 1 nm, about 2 nm, about 3 nm, about 4 nm, about 5 nm, about 8 nm, or about 10 nm to about 12 nm, about 15 nm, about 20 nm, about 35 nm, about 50 nm, about 80 nm, about 100 nm, or greater. For example, each of the openings 222 can have a diameter or width of about 1 nm about 100 nm, about 1 nm about 80 nm, about 1 nm about 50 nm, about 1 nm about 30 nm, about 1 nm about 20 nm, about 1 nm about 10 nm, about 5 nm about 100 nm, about 5 nm about 80 nm, about 5 nm about 50 nm, about 5 nm about 30 nm, about 5 nm about 20 nm, about 5 nm about 10 nm, about 10 nm about 100 nm, about 10 nm about 80 nm, about 10 nm about 50 nm, about 10 nm about 30 nm, about 10 nm about 20 nm, or about 10 nm about 15 nm.

Figure 2D:
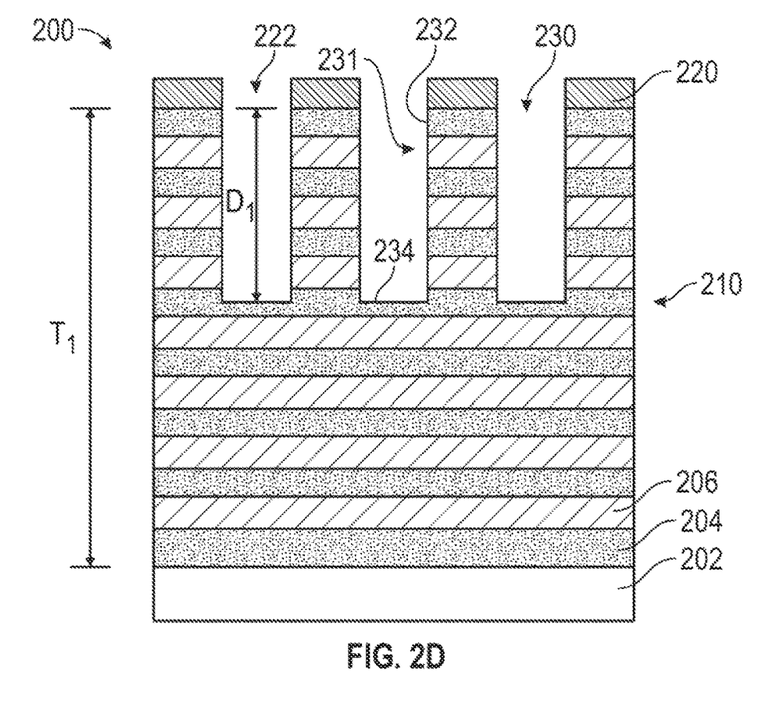

At operation 130 of the method 100, the film stack 210 is etched to a first depth ($D_1$) to form a plurality of openings 230 between a plurality of structures 231, as depicted in FIG. 2D. Each of the structures 231 has a sidewall 232 and each of the openings 230 has a bottom 234. The openings 230 do not go all the way through to the substrate 202. As such, the first depth ($D_1$) is less than the stack thickness (Ti). The openings 230 have a very high aspect ratio. Each of the openings 230 has an aspect ratio of greater than 100 relative to the first depth ($D_1$). The aspect ratio of the openings 230 can be about 120, about 150, or about 180 to about 200, about 250, about 300, about 350, about 400, about 500, or greater. In one or more examples, each of the openings 230 has an aspect ratio of greater than 100 to about 500, greater than 100 to about 400, or greater than 100 to about 300 relative to the first depth ($D_1$). In other examples, each of the openings 230 has an aspect ratio of about 120 to about 500, about 120 to about 300, or about 120 to about 200 relative to the first depth ($D_1$).

In one or more embodiments, the first depth ($D_1$) is about 0.5 μm, about 0.8 μm, about 1 μm, about 1.2 μm, or about 1.5 μm to about 1.8 μm, about 2 μm, about 2.5 μm, about 3 μm, about 4 μm, about 5 μm, about 6 μm, about 7 μm, about 8 μm, about 9 μm, about 10 μm, about 12 μm, or greater. For example, the first depth ($D_1$) is about 0.5 μm to about 12 μm, about 0.5 μm to about 10 μm, about 0.5 μm to about 8 μm, about 0.5 μm to about 6 μm, about 0.5 μm to about 5 μm, about 0.5 μm to about 3 μm, about 0.5 μm to about 1 μm, about 0.8 μm to about 12 μm, about 0.8 μm to about 10 μm, about 0.8 μm to about 8 μm, about 0.8 μm to about 6 μm, about 0.8 μm to about 5 μm, about 0.8 μm to about 3 μm, about 0.8 μm to about 1 μm, about 1 μm to about 12 μm, about 1 μm to about 10 μm, about 1 μm to about 8 μm, about 1 μm to about 6 μm, about 1 μm to about 5 μm, about 1 μm to about 3 μm, or about 1 μm to about 2 μm.

In one or more embodiments, each of the openings 230 can have a diameter or width of about 1 nm, about 10 nm, about 50 nm, about 100 nm, about 200 nm, about 300 nm, or about 400 nm to about 500 nm, about 750 nm, about 1,000 nm, about 1,500 nm, about 2,000 nm, about 2,500 nm, about 3,000 nm, or greater. For example, each of the openings 230 can have a diameter or width of about 1 nm about 3,000 nm, about 1 nm about 2,000 nm, about 1 nm about 1,000 nm, about 1 nm about 800 nm, about 1 nm about 500 nm, about 1 nm about 300 nm, about 1 nm about 100 nm, about 100 nm about 3,000 nm, about 100 nm about 2,000 nm, about 100 nm about 1,000 nm, about 100 nm about 800 nm, about 100 nm about 500 nm, about 100 nm about 300 nm, about 100 nm about 200 nm, about 500 nm about 3,000 nm, about 500 nm about 2,000 nm, about 500 nm about 1,000 nm, about 500 nm about 800 nm, or about 500 nm about 600 nm.

In other embodiments, each of the openings 230 can have a diameter or width of about 1 nm, about 2 nm, about 3 nm, about 4 nm, about 5 nm, about 8 nm, or about 10 nm to about 12 nm, about 15 nm, about 20 nm, about 35 nm, about 50 nm, about 80 nm, about 100 nm, or greater. For example, each of the openings 230 can have a diameter or width of about 1 nm about 100 nm, about 1 nm about 80 nm, about 1 nm about 50 nm, about 1 nm about 30 nm, about 1 nm about 20 nm, about 1 nm about 10 nm, about 5 nm about 100 nm, about 5 nm about 80 nm, about 5 nm about 50 nm, about 5 nm about 30 nm, about 5 nm about 20 nm, about 5 nm about 10 nm, about 10 nm about 100 nm, about 10 nm about 80 nm, about 10 nm about 50 nm, about 10 nm about 30 nm, about 10 nm about 20 nm, or about 10 nm about 15 nm.

The etch process is relatively substantially directional and straight into the film stack 210. As used herein, an etch process which is "substantially directional" refers to a process which removes quantities of a material in one direction over another direction (e.g., removes a vertical trench from a film stack, without etching the sidewalls of the trench). A process which is substantially directional preferentially removes material in a first direction at a rate that is 10, 20, 50 or 100 times faster than material removed in a second direction orthogonal to the first.

Figure 2E:
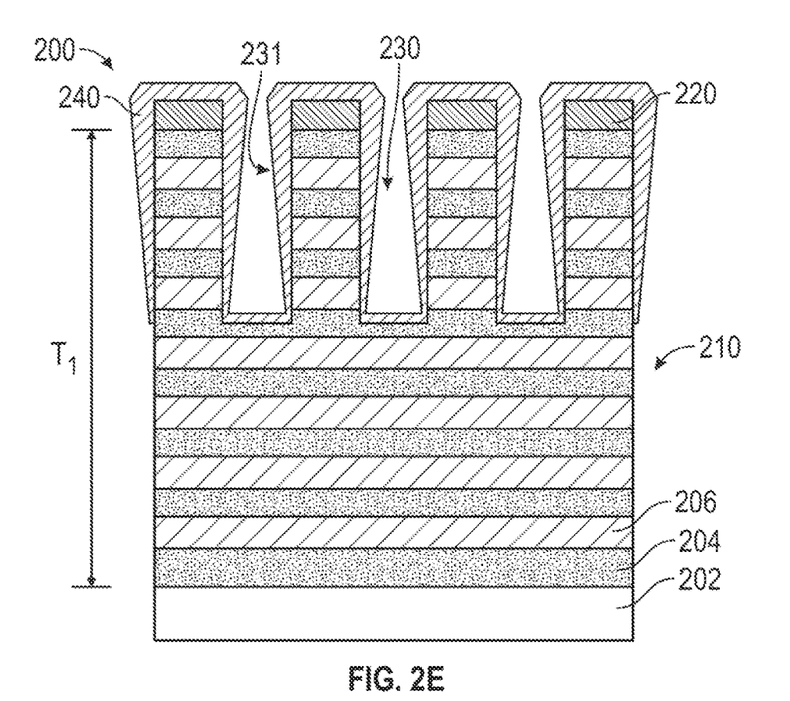

At operation 140 of the method 100, an etch protection liner 240 is deposited, disposed, or otherwise formed on the patterned hard mask 220, the sidewalls 232, and the bottoms 234, as depicted in FIG. 2E. The etch protection liner 240 contains amorphous-silicon. The thickness of the etch protection liner 240 deposited on the bottoms 234 of the openings 230 is less than the thickness of the etch protection liner 240 deposited on the sidewalls 232 of the structures 231.

The etch protection liner 240 can be deposited by a vapor deposition process, such as thermal chemical vapor deposition (CVD), plasma-enhanced CVD (PE-CVD), pulsed-CVD, thermal atomic layer deposition (ALD), plasma-enhanced ALD (PE-ALD), or other deposition process. In one or more examples, the etch protection liner 240 is deposited by a thermal CVD process. The thermal CVD process includes exposing the sidewalls 232 and the bottoms 234 to one or more process gases containing one or more silicon precursors. Exemplary silicon precursors can be or include silane, disilane, trisilane, tetrasilane, other higher silanes, or any combination thereof. The process gas can include one or more carrier gases or other gases, such as argon, nitrogen ($N_2$), helium, neon, hydrogen ($H_2$), or any combination thereof. In one or more examples the process gas contains disilane, argon, and hydrogen gas.

In one or more embodiments, the silicon precursor is introduced to the substrate independently or combined with one, two, or more other gases to form the process gas. The silicon precursor can have at a flow rate of about 20 sccm, about 50 sccm, or about 80 sccm to about 100 sccm, about 150 sccm, about 200 sccm, about 250 sccm, about 300 sccm, about 400 sccm, or about 500 sccm. For example, the silicon precursor can have at a flow rate of about 20 sccm to about 500 sccm, about 20 sccm to about 300 sccm, about 20 sccm to about 200 sccm, about 20 sccm to about 150 sccm, about 20 sccm to about 100 sccm, about 20 sccm to about 50 sccm, about 50 sccm to about 500 sccm, about 50 sccm to about 300 sccm, about 50 sccm to about 200 sccm, about 50 sccm to about 150 sccm, about 50 sccm to about 100 sccm, about 50 sccm to about 80 sccm, about 100 sccm to about 500 sccm, about 100 sccm to about 300 sccm, about 100 sccm to about 200 sccm, about 100 sccm to about 150 sccm, or about 100 sccm to about 120 sccm.

The carrier gas (e.g., argon, helium, or nitrogen gas) can have at a flow rate of about 500 sccm, about 800 sccm, about 1,000 sccm, or about 1,500 sccm to about 2,000 sccm, about 2,500 sccm, about 3,000 sccm, about 4,000 sccm, about 5,000 sccm, about 6,000 sccm, about 8,000 sccm, or greater. For example, the carrier gas can have at a flow rate of about 500 sccm to about 6,000 sccm, about 500 sccm to about 5,000 sccm, about 500 sccm to about 4,000 sccm, about 500 sccm to about 3,000 sccm, about 500 sccm to about 2,000 sccm, about 500 sccm to about 1,000 sccm, about 1,000 sccm to about 6,000 sccm, about 1,000 sccm to about 5,000 sccm, about 1,000 sccm to about 4,000 sccm, about 1,000 sccm to about 3,000 sccm, about 1,000 sccm to about 2,000 sccm, about 1,000 sccm to about 1,500 sccm, about 2,000 sccm to about 6,000 sccm, about 2,000 sccm to about 5,000 sccm, about 2,000 sccm to about 4,000 sccm, about 2,000 sccm to about 3,000 sccm, or about 2,000 sccm to about 2,500 sccm.

The hydrogen gas can have at a flow rate of about 20 sccm, about 50 sccm, or about 80 sccm to about 100 sccm, about 150 sccm, about 200 sccm, about 250 sccm, about 300 sccm, about 400 sccm, or about 500 sccm. For example, the hydrogen gas can have at a flow rate of about 20 sccm to about 500 sccm, about 20 sccm to about 300 sccm, about 20 sccm to about 200 sccm, about 20 sccm to about 150 sccm, about 20 sccm to about 100 sccm, about 20 sccm to about 50 sccm, about 50 sccm to about 500 sccm, about 50 sccm to about 300 sccm, about 50 sccm to about 200 sccm, about 50 sccm to about 150 sccm, about 50 sccm to about 100 sccm, about 50 sccm to about 80 sccm, about 100 sccm to about 500 sccm, about 100 sccm to about 300 sccm, about 100 sccm to about 200 sccm, about 100 sccm to about 150 sccm, or about 100 sccm to about 120 sccm.

In some embodiments, the etch protection liner 240 is deposited by a thermal CVD process and the substrate is maintained at a temperature of about 250° C., about 300° C., about 350° C., about 400° C., about 410° C., about 420° C., or about 450° C. to about 480° C., about 500° C., about 520° C., about 540° C., about 550° C., about 580° C., about 600° C., or about 650° C. For example, during the thermal CVD process, the substrate is maintained at a temperature of about 250° C. to about 650° C., about 250° C. to about 600° C., about 250° C. to about 550° C., about 250° C. to about 500° C., about 250° C. to about 450° C., about 250° C. to about 400° C., about 325° C. to about 650° C., about 325° C. to about 600° C., about 325° C. to about 550° C., about 325° C. to about 500° C., about 325° C. to about 450° C., about 325° C. to about 400° C., about 400° C. to about 650° C., about 400° C. to about 600° C., about 400° C. to about 550° C., about 400° C. to about 500° C., about 400° C. to about 450° C., or about 400° C. to about 425° C. Also, during the CVD process, the process volume of the interior of the chamber can be maintained at a pressure of about 1 Torr, about 3 Torr, about 6 Torr, or about 10 Torr to about 12 Torr, about 15 Torr, about 20 Torr, about 25 Torr, about 30 Torr, or about 50 Torr. For example, the process volume of the interior of the chamber can be maintained at a pressure of about 1 Torr to about 50 Torr, about 5 Torr to about 50 Torr, about 10 Torr to about 50 Torr, about 1 Torr to about 35 Torr, about 1 Torr to about 25 Torr, about 1 Torr to about 20 Torr, about 1 Torr to about 15 Torr, or about 1 Torr to about 10 Torr.

The etch protection liner 240 has a thickness of about 1 nm, about 2 nm, about 3 nm, about 5 nm, about 8 nm, or about 10 nm to about 12 nm, about 15 nm, about 18 nm, about 20 nm, about 25 nm, about 30 nm, about 35 nm, about 40 nm, about 45 nm, about 50 nm, about 80 nm, about 100 nm, or greater. For example, the etch protection liner 240 has a thickness of about 1 nm to about 100 nm, about 1 nm to about 80 nm, about 1 nm to about 50 nm, about 1 nm to about 40 nm, about 1 nm to about 35 nm, about 1 nm to about 30 nm, about 1 nm to about 25 nm, about 1 nm to about 20 nm, about 1 nm to about 15 nm, about 1 nm to about 10 nm, about 1 nm to about 8 nm, about 1 nm to about 5 nm, about 2 nm to about 100 nm, about 2 nm to about 50 nm, about 2 nm to about 35 nm, about 2 nm to about 20 nm, about 2 nm to about 15 nm, about 2 nm to about 10 nm, about 2 nm to about 5 nm, about 10 nm to about 100 nm, about 10 nm to about 80 nm, about 10 nm to about 50 nm, about 10 nm to about 40 nm, about 10 nm to about 35 nm, about 10 nm to about 30 nm, about 10 nm to about 25 nm, about 10 nm to about 20 nm, about 10 nm to about 15 nm, about 10 nm to about 12 nm, about 20 nm to about 100 nm, about 20 nm to about 80 nm, about 20 nm to about 50 nm, about 20 nm to about 40 nm, about 20 nm to about 35 nm, about 20 nm to about 30 nm, about 20 nm to about 25 nm, or about 20 nm to about 22 nm.

In one or more embodiments, as depicted in FIG. 2E, the microelectronic device 200 is provided and includes the film stack 210 disposed on the substrate 202, where the film stack 210 contains the plurality of alternating layers of oxide layers 204 and nitride layers 206, the patterned hard mask 220 disposed on an upper surface of the film stack 210, and the plurality of openings 230 having the first depth ($D_1$) disposed between the plurality of structures 231. Each structure has a sidewall 232 and each opening 230 has the bottom 234, where the first depth ($D_1$) is less than the stack thickness, and each opening 230 has an aspect ratio of greater than 100 relative to the first depth ($D_1$). The microelectronic device 200 also includes the etch protection liner 240 containing amorphous-silicon disposed on the patterned hard mask 220, the sidewalls 232, and the bottoms 234. In some example, the etch protection liner 240 has a thickness of about 1 nm to about 50 nm.

Figure 2F:
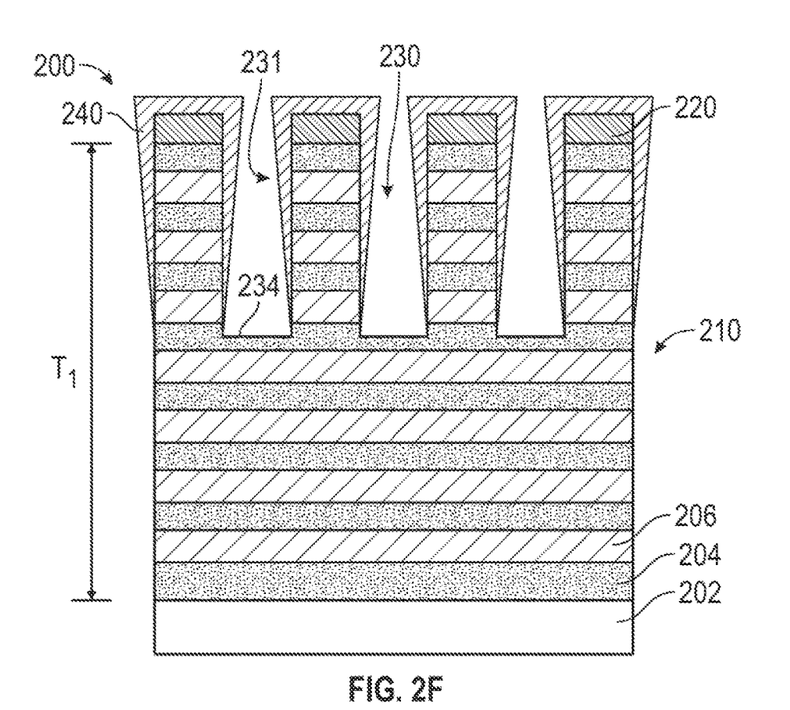

At operation 150 of the method 100, at least a portion of the etch protection liner 240 is etched or otherwise removed from at least the bottoms 234 of the openings 230 during a bottom punch process, as depicted in FIG. 2F. In some embodiments, all or a substantial amount of the etch protection liner 240 is still disposed on the patterned hard mask 220 and the sidewalls 232 of the structures 231. In some examples, the bottom punch process can include exposing the etch protection liner 240 to an acidic solution (e.g., HF solution) during a wet-etch process. In other examples, the bottom punch process can include exposing the etch protection liner 240 to a plasma (e.g., $NF_3$, $O_2$, or Ar) during a dry-etch process, or a reactive ion etch (RIE) process.

Figure 2G:
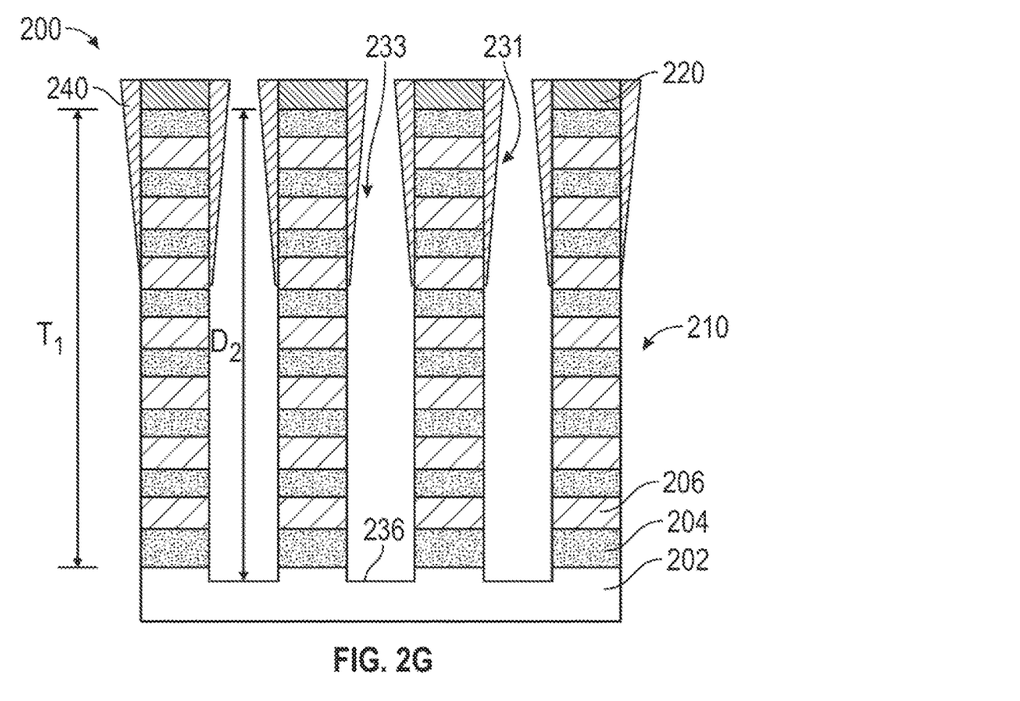

At operation 160 of the method 100, a plurality of holes 233 are etched or otherwise formed into the film stack 210 in the openings 230 to further extend each bottom 234 of the openings 230 to a second depth ($D_2$) of the hole 233 during a final etch process, as depicted in FIG. 2G. In essence, the openings 230 are converted to the holes 233 and the bottom 234 is converted to the bottom 236, which is within the substrate 202. The etch protection liner 240 can also be etched or otherwise removed from the patterned hard mask 220. In some examples, the final etch process can include exposing the film stack 210 and a portion of the substrate 202 to an acidic solution (e.g., HF solution) during a wet-etch process. In other examples, the final etch process can include exposing the film stack 210 and a portion of the substrate 202 to a plasma (e.g., $NF_3$, $O_2$, or Ar) during a dry-etch process, or an RIE process.

The second depth ($D_2$) is measured between the upper surface of the film stack 210 and the bottom 236 of the hole 233. The second depth ($D_2$) is about 0.8 µm, about 1 µm, about 1.2 µm, or about 1.5 µm, about 1.8 µm, or about 2 µm to about 2.5 µm, about 3 µm, about 4 µm, about 5 µm, about 6 µm, about 7 µm, about 8 µm, about 9 µm, about 10 µm, about 12 µm, about 15 µm, about 18 µm, about 20 µm, about 25 µm, or greater. For example, the second depth ($D_2$) is about 1 µm to about 20 µm, about 1 µm to about 18 µm, about 1 µm to about 15 µm, about 1 µm to about 12 µm, about 1 µm to about 10 µm, about 1 µm to about 8 µm, 1 µm to about 5 µm, about 3 µm to about 20 µm, about 3 µm to about 18 µm, about 3 µm to about 15 µm, about 3 µm to about 12 µm, about 3 µm to about 10 µm, about 3 µm to about 8 µm, about 3 µm to about 5 µm, about 5 µm to about 20 µm, about 5 µm to about 18 µm, about 5 µm to about 15 µm, about 5 µm to about 12 µm, about 5 µm to about 10 µm, or about 5 µm to about 8 µm.

In one or more embodiments, each of the holes 233 can have a diameter or width of about 1 nm, about 10 nm, about 50 nm, about 100 nm, about 200 nm, about 300 nm, or about 400 nm to about 500 nm, about 750 nm, about 1,000 nm, about 1,500 nm, about 2,000 nm, about 2,500 nm, about 3,000 nm, or greater. For example, each of the holes 233 can have a diameter or width of about 1 nm about 3,000 nm, about 1 nm about 2,000 nm, about 1 nm about 1,000 nm, about 1 nm about 800 nm, about 1 nm about 500 nm, about 1 nm about 300 nm, about 1 nm about 100 nm, about 100 nm about 3,000 nm, about 100 nm about 2,000 nm, about 100 nm about 1,000 nm, about 100 nm about 800 nm, about 100 nm about 500 nm, about 100 nm about 300 nm, about 100 nm about 200 nm, about 500 nm about 3,000 nm, about 500 nm about 2,000 nm, about 500 nm about 1,000 nm, about 500 nm about 800 nm, or about 500 nm about 600 nm.

In other embodiments, each of the holes 233 can have a diameter or width of about 1 nm, about 2 nm, about 3 nm, about 4 nm, about 5 nm, about 8 nm, or about 10 nm to about 12 nm, about 15 nm, about 20 nm, about 35 nm, about 50 nm, about 80 nm, about 100 nm, or greater. For example, each of the holes 233 can have a diameter or width of about 1 nm about 100 nm, about 1 nm about 80 nm, about 1 nm about 50 nm, about 1 nm about 30 nm, about 1 nm about 20 nm, about 1 nm about 10 nm, about 5 nm about 100 nm, about 5 nm about 80 nm, about 5 nm about 50 nm, about 5 nm about 30 nm, about 5 nm about 20 nm, about 5 nm about 10 nm, about 10 nm about 100 nm, about 10 nm about 80 nm, about 10 nm about 50 nm, about 10 nm about 30 nm, about 10 nm about 20 nm, or about 10 nm about 15 nm.

Figure 2H:
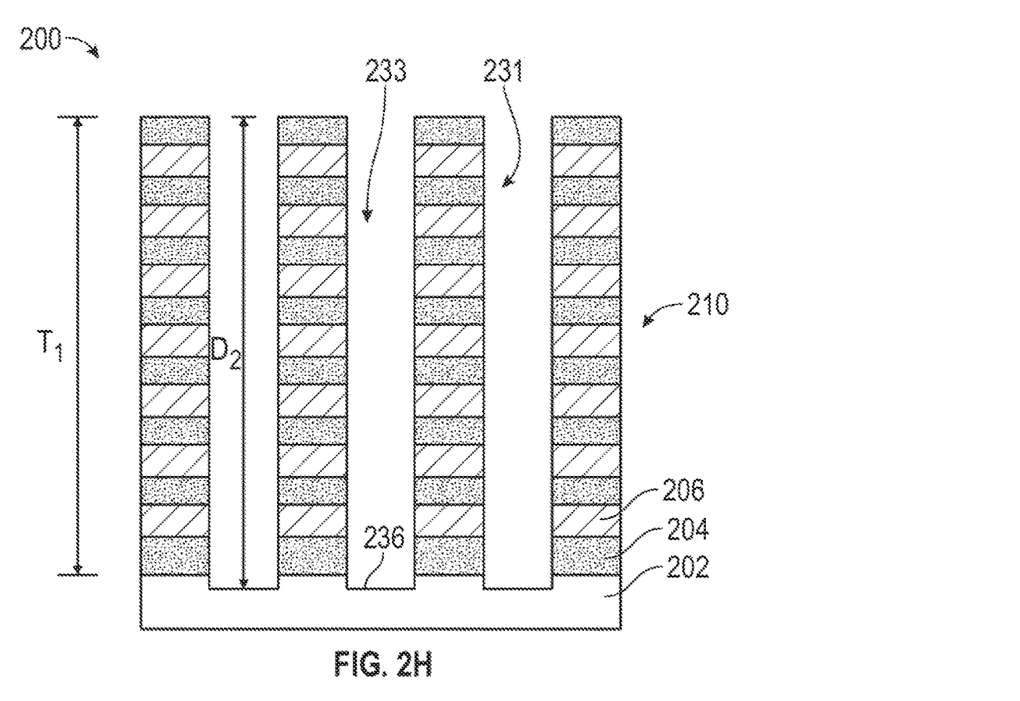

At operation 170 of the method 100, the remaining portion of the etch protection liner 240 is etched or otherwise removed from at least the sidewalls 232 during a stripping process, as depicted in FIG. 2H. The patterned hard mask 220 can also be etched or otherwise removed from the structures 231 and/or the film stack 210. In some examples, the stripping process can include exposing the etch protection liner 240 to an acidic solution (e.g., HF solution) during a wet-etch process. In other examples, the stripping process can include exposing the etch protection liner 240 to a plasma (e.g., $NF_3$, $O_2$, or Ar) during a dry-etch process, or an RIE process.

The microelectronic device 200 depicted in FIG. 2H has been fabricated by the method 100. In one or more examples, the microelectronic device 200 is a memory device and each of the holes 233 can be a memory hole or a word line slit. In some examples, the hole has a reduced bow critical dimension (CD) of about 20 nm to about 150 nm, about 25 nm to about 100 nm, or about 30 nm to about 80 nm, such as about 50 nm. In one or more embodiments, where each of the holes 233 is a memory hole or a word line slit, the microelectronic device 200 can be a memory device or a logic device, e.g., NOT-AND (NAND) flash memory, vertical NAND (V-NAND) memory, 3D NAND memory, dynamic random-access memory (DRAM), or other memory devices. As used herein, the term "3D NAND" refers to a type of electronic (solid-state) non-volatile computer storage memory in which the memory cells are stacked in multiple layers. 3D NAND memory generally includes a plurality of memory cells that include floating-gate transistors. Traditionally, 3D NAND memory cells include a plurality of NAND memory structures arranged in three dimensions around a bit line.

In one or more embodiments, multiple operations and manufacturing processes for fabricating the microelectronic device during the method 100 described and discussed herein, can be performed in a CVD chamber, such as a thermal CVD chamber, a PE-CVD chamber, a high-density plasma CVD chamber, a low pressure CVD chamber, a reduced pressure CVD chamber, or an atmospheric pressure CVD chamber. In other embodiments, multiple operations and manufacturing processes for fabricating the microelectronic device during the method 100 described and discussed herein, can be performed in a PVD chamber, an ALD chamber, a PE-ALD chamber, an etch chamber (thermal or plasma), an epitaxy chamber, an anneal chamber, or any other processing chamber in which temperature monitoring might be useful. Examples of the processing chamber can include CVD chambers such as AKT® PECVD chambers, PRODUCER™ chambers, Eterna FCVD® chambers, and PRECISION 5000® chambers, commercially available from Applied Materials Inc., Santa Clara, Calif.

Embodiments of the present disclosure further relate to any one or more of the following paragraphs 1-15:

1. A method for forming a device, comprising: forming a film stack on a substrate, wherein the film stack comprises a plurality of alternating layers of oxide layers and nitride layers and has a stack thickness; etching the film stack to a first depth to form a plurality of openings between a plurality of structures, wherein each structure has a sidewall and each opening has a bottom, wherein the first depth is less than the stack thickness, and wherein each opening has an aspect ratio of greater than 50 relative to the first depth; depositing an etch protection liner comprising amorphous-silicon on the sidewalls and the bottoms; removing the etch protection liner from at least the bottoms of the openings; forming a plurality of holes by etching the film stack in the openings to further extend each bottom of the openings to a second depth of the hole; and removing the etch protection liner from the sidewalls.

2. A method for forming a device, comprising: forming a film stack on a substrate, wherein the film stack comprises a plurality of alternating layers of oxide layers and nitride layers and has a stack thickness; forming a patterned hard mask on the film stack; etching the film stack to a first depth to form a plurality of openings between a plurality of structures, wherein each structure has a sidewall and each opening has a bottom, wherein the first depth is less than the stack thickness, and wherein each opening has an aspect ratio of greater than 100 relative to the first depth; depositing an etch protection liner comprising amorphous-silicon on the sidewalls and the bottoms by a thermal chemical vapor deposition (CVD) process, wherein the etch protection liner has a thickness of about 1 nm to about 50 nm; removing the etch protection liner from at least the bottoms of the openings; forming a plurality of holes by etching the film stack in the openings to further extend each bottom of the openings to a second depth of the hole; and removing the etch protection liner from the sidewalls.

3. The method according to paragraph 1 or 2, wherein each opening has an aspect ratio of greater than 100 to about 500 relative to the first depth.

4. The method according to any one of paragraphs 1-3, wherein each opening has an aspect ratio of about 120 to about 500 relative to the first depth.

5. The method according to any one of paragraphs 1-4, wherein a thickness of the etch protection liner deposited on the bottoms of the openings is less than a thickness of the etch protection liner deposited on the sidewalls of the structures.

6. The method according to any one of paragraphs 1-5, wherein the etch protection liner is deposited by a thermal chemical vapor deposition (CVD) process.

7. The method according to any one of paragraphs 1-6, wherein the thermal CVD process comprises exposing the sidewalls and the bottoms to a process gas comprising a silicon precursor selected from the group consisting of silane, disilane, trisilane, tetrasilane, and any combination thereof.

8. The method according to any one of paragraphs 1-7, wherein the etch protection liner has a thickness of about 1 nm to about 50 nm.

9. The method according to any one of paragraphs 1-8, wherein the etch protection liner has a thickness of about 2 nm to about 10 nm.

10. The method according to any one of paragraphs 1-9, wherein the stack thickness is in a range of about 1 µM to about 10 µM.

11. The method according to any one of paragraphs 1-10, wherein the plurality of alternating layers of oxide layers and nitride layers comprises about 20 pairs to about 200 pairs of oxide layers and nitride layers.

12. The method according to any one of paragraphs 1-11, wherein each of the openings and each of the holes independently have a width of about 1 nm to about 3,000 nm.

13. The method according to any one of paragraphs 1-12, wherein the second depth is in a range of about 1 µM to about 10 µM.

14. The method according to any one of paragraphs 1-13, wherein each of the holes is a memory hole or a word line slit.

15. A microelectronic device, comprising: a film stack disposed on a substrate, wherein the film stack comprises a plurality of alternating layers of oxide layers and nitride layers and has a stack thickness; a patterned hard mask disposed on an upper surface of the film stack; a plurality of openings having a first depth disposed between a plurality of structures, wherein each structure has a sidewall and each opening has a bottom, wherein the first depth is less than the stack thickness, and wherein each opening has an aspect ratio of greater than 50, greater than 100, or greater than 120 relative to the first depth; and an etch protection liner comprising amorphous-silicon disposed on the patterned hard mask, the sidewalls, and the bottoms, wherein the etch protection liner has a thickness of about 1 nm to about 50 nm.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated. As used herein, the term "about" refers to a +/−10% variation from the nominal value. It is to be understood that such a variation can be included in any value provided herein.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for forming a device, comprising:
    forming a film stack on a substrate, wherein the film stack comprises a plurality of alternating layers of oxide layers and nitride layers and has a stack thickness;
    etching the film stack to a first depth to form a plurality of openings between a plurality of structures, wherein each structure has a sidewall and each opening has a bottom, wherein the first depth is less than the stack thickness, and wherein each opening has an aspect ratio of greater than 50 relative to the first depth;
    depositing an etch protection liner comprising amorphous-silicon on the sidewalls and the bottoms;
    removing the etch protection liner from at least the bottoms of the openings;
    forming a plurality of holes by etching the film stack in the openings to further extend each bottom of the openings to a second depth of the hole; and
    removing the etch protection liner from the sidewalls.

2. The method of claim 1, wherein each opening has an aspect ratio of greater than 100 to about 500 relative to the first depth.

3. The method of claim 1, wherein a thickness of the etch protection liner deposited on the bottoms of the openings is less than a thickness of the etch protection liner deposited on the sidewalls of the structures.

4. The method of claim 1, wherein the etch protection liner is deposited by a thermal chemical vapor deposition (CVD) process.

5. The method of claim 4, wherein the thermal CVD process comprises exposing the sidewalls and the bottoms to a process gas comprising a silicon precursor selected from the group consisting of silane, disilane, trisilane, tetrasilane, and any combination thereof.

6. The method of claim 1, wherein the etch protection liner has a thickness of about 1 nm to about 50 nm.

7. The method of claim 1, wherein the etch protection liner has a thickness of about 2 nm to about 10 nm.

8. The method of claim 1, wherein the stack thickness is in a range of about 1 µM to about 10 µM.

9. The method of claim 1, wherein the plurality of alternating layers of oxide layers and nitride layers comprises about 20 pairs to about 200 pairs of oxide layers and nitride layers.

10. The method of claim 1, wherein each of the openings and each of the holes independently have a width of about 1 nm to about 3,000 nm.

11. The method of claim 1, wherein the second depth is in a range of about 1 µM to about 10 µM.

12. The method of claim 1, wherein each of the holes is a memory hole or a word line slit.

13. A method for forming a device, comprising:
  forming a film stack on a substrate, wherein the film stack comprises a plurality of alternating layers of oxide layers and nitride layers and has a stack thickness;
  forming a patterned hard mask on the film stack;
  etching the film stack to a first depth to form a plurality of openings between a plurality of structures, wherein each structure has a sidewall and each opening has a bottom, wherein the first depth is less than the stack thickness, and wherein each opening has an aspect ratio of greater than 100 relative to the first depth;
  depositing an etch protection liner comprising amorphous-silicon on the sidewalls and the bottoms by a thermal chemical vapor deposition (CVD) process, wherein the etch protection liner has a thickness of about 1 nm to about 50 nm;
  removing the etch protection liner from at least the bottoms of the openings;
  forming a plurality of holes by etching the film stack in the openings to further extend each bottom of the openings to a second depth of the hole; and
  removing the etch protection liner from the sidewalls.

14. The method of claim 13, wherein each opening has an aspect ratio of about 120 to about 500 relative to the first depth.

15. The method of claim 13, wherein a thickness of the etch protection liner deposited on the bottoms of the openings is less than a thickness of the etch protection liner deposited on the sidewalls of the structures.

16. The method of claim 13, wherein the thermal CVD process comprises exposing the sidewalls and the bottoms to a process gas comprising a silicon precursor selected from the group consisting of silane, disilane, trisilane, tetrasilane, and any combination thereof.

17. The method of claim 13, wherein the etch protection liner has a thickness of about 2 nm to about 20 nm.

18. The method of claim 13, wherein each of the openings and each of the holes independently have a width of about 1 nm to about 3,000 nm.

19. The method of claim 13, wherein the second depth is in a range of about 1 µM to about 10 µM.

20. A microelectronic device, comprising:
  a film stack disposed on a substrate, wherein the film stack comprises a plurality of alternating layers of oxide layers and nitride layers and has a stack thickness;
  a patterned hard mask disposed on an upper surface of the film stack;
  a plurality of openings having a first depth disposed between a plurality of structures, wherein each structure has a sidewall and each opening has a bottom, wherein the first depth is less than the stack thickness, and wherein each opening has an aspect ratio of greater than 100 relative to the first depth; and
  an etch protection liner comprising amorphous-silicon disposed on the patterned hard mask, the sidewalls, and the bottoms, wherein the etch protection liner has a thickness of about 1 nm to about 50 nm.

* * * * *